United States Patent
Robson et al.

(10) Patent No.: US 9,639,001 B2
(45) Date of Patent: May 2, 2017

(54) OPTICALLY TRANSITIONED METAL-INSULATOR SURFACE

(71) Applicant: Raytheon Company, Waltham, MA (US)

(72) Inventors: Michael H. Robson, Albuquerque, NM (US); Michael T. Pace, Albuquerque, NM (US)

(73) Assignee: RAYTHEON COMPANY, Waltham, MA (US)

( * ) Notice: Subject to any disclaimer, the term of this patent is extended or adjusted under 35 U.S.C. 154(b) by 526 days.

(21) Appl. No.: 14/172,244

(22) Filed: Feb. 4, 2014

(65) Prior Publication Data

US 2015/0219855 A1    Aug. 6, 2015

(51) Int. Cl.
| G02B 6/26 | (2006.01) |
| G03F 7/20 | (2006.01) |
| G03F 7/09 | (2006.01) |
| H05K 1/02 | (2006.01) |
| H05K 3/10 | (2006.01) |
| G02B 6/42 | (2006.01) |

(52) U.S. Cl.
CPC ............ *G03F 7/2053* (2013.01); *G03F 7/093* (2013.01); *G03F 7/2004* (2013.01); *H05K 1/0292* (2013.01); *H05K 3/105* (2013.01); *G02B 6/4295* (2013.01)

(58) Field of Classification Search
CPC ....... H05K 3/105; H05K 3/106; H01L 49/003
See application file for complete search history.

(56) References Cited

U.S. PATENT DOCUMENTS

| 4,751,513 A | 6/1988 | Daryoush et al. |
| 4,777,456 A | 10/1988 | Andrikian et al. |
| 4,835,500 A | 5/1989 | Sequeira |
| 5,099,214 A | 3/1992 | Rosen et al. |
| 5,481,232 A | 1/1996 | Wu et al. |
| 5,514,499 A | 5/1996 | Iwamatsu et al. |

(Continued)

FOREIGN PATENT DOCUMENTS

| EP | 1345419 B1 | 11/2009 |
| EP | 1753084 B1 | 8/2011 |

(Continued)

OTHER PUBLICATIONS

Korala et al., "Transparent conducting films of CdSe(ZnS) core (shell) quantum dot xerogels", Chem. Commun. vol. 48, 2012, pp. 8523-8525.

(Continued)

*Primary Examiner* — Rhonda Peace
(74) *Attorney, Agent, or Firm* — Cantor Colburn LLP

(57) ABSTRACT

A system to dynamically configure a conductive pathway and a method of forming a dynamically configurable conductive pathway are described. The system includes a substrate to mechanically support a circuit, and a photosensitive layer disposed on at least a portion of at least one side of the substrate. The system also includes a light source to controllably define the conductive pathway in the photosensitive layer based on photoexcitation of an area of the photosensitive layer corresponding with the conductive pathway, a change in the area photoexcited by the light source facilitating a change in the conductive pathway.

18 Claims, 3 Drawing Sheets

(56) References Cited

U.S. PATENT DOCUMENTS

| | | | |
|---|---|---|---|
| 5,761,351 A | 6/1998 | Johnson | |
| 6,274,916 B1* | 8/2001 | Donath | H01L 49/003 257/192 |
| 6,313,803 B1 | 11/2001 | Manasson et al. | |
| 6,483,480 B1 | 11/2002 | Sievenpiper et al. | |
| 6,646,525 B2 | 11/2003 | Bozler et al. | |
| 7,271,877 B2 | 9/2007 | Fries | |
| 7,466,269 B2 | 12/2008 | Haziza | |
| 8,142,688 B2* | 3/2012 | Kobayashi | G03F 7/0047 252/511 |
| 8,279,122 B2 | 10/2012 | Landon et al. | |
| 8,298,905 B2* | 10/2012 | Ito | H01L 21/76823 257/665 |
| 8,373,609 B1 | 2/2013 | Dorsey et al. | |
| 8,384,426 B2 | 2/2013 | Or-Bach | |
| 8,557,642 B2* | 10/2013 | Schroder | B29C 35/0266 257/E21.411 |
| 2002/0043927 A1 | 4/2002 | Kimura | |
| 2002/0085390 A1 | 7/2002 | Kiyomoto et al. | |
| 2004/0067431 A1* | 4/2004 | Arney | B82Y 10/00 430/138 |
| 2004/0234270 A1 | 11/2004 | Nishie et al. | |
| 2005/0139867 A1* | 6/2005 | Saito | H01L 49/003 257/213 |
| 2006/0222889 A1* | 10/2006 | Kobayashi | G03F 7/0047 428/690 |
| 2008/0136337 A1 | 6/2008 | Rogojevic et al. | |
| 2010/0040987 A1* | 2/2010 | Temchenko | G03F 7/70558 430/325 |
| 2010/0233874 A1* | 9/2010 | Ito | H01L 21/76823 438/600 |
| 2013/0141295 A1 | 6/2013 | Jiang et al. | |
| 2014/0168751 A1 | 6/2014 | Suzuki et al. | |
| 2015/0144380 A1* | 5/2015 | Yang | H05K 1/097 174/253 |
| 2015/0219855 A1* | 8/2015 | Robson | H05K 3/00 385/16 |
| 2015/0221807 A1* | 8/2015 | Robson | H01L 31/173 257/84 |
| 2015/0222019 A1* | 8/2015 | Robson | H01Q 1/364 343/904 |
| 2015/0222966 A1* | 8/2015 | Robson | H04Q 3/00 398/45 |

FOREIGN PATENT DOCUMENTS

| | | |
|---|---|---|
| EP | 2575211 A1 | 4/2013 |
| WO | 0120718 A1 | 3/2001 |

OTHER PUBLICATIONS

Lilly et al., "Switchable photoconductivity of quantum dot films using cross-linking ligands with light-sensitive structures", Journal of Material Chemistry, vol. 21, No. 31, Aug. 21, 2011, pp. 11441-11652.

Mentzel et al., "Nanopatterned Electrically Conductive Films of Semiconductor Nanocrystals", Nano Letters 12, No. 8, Aug. 8, 2012, pp. 1-18.

* cited by examiner

OPTICALLY TRANSITIONED METAL-INSULATOR SURFACE

BACKGROUND

The present disclosure relates to switchable conductivity. In many applications, mechanical supports are used for electrical connections. For example, a printed circuit board (PCB) provides mechanical support for the electrical connections between components. The PCB includes conductive traces that are placed onto an insulating substrate. The form of each conductive trace is fixed after the design is complete, while the function of the traces can be controlled using discrete components such as switches. Jumper wires may be added to implement the alternate routing as an alternative, but these connections can become loose and affect the integrity of the conductive traces such that only pathways that were anticipated during the design and layout phase of the PCB are practicable.

SUMMARY

According to one embodiment, a system to dynamically configure a conductive pathway includes a substrate configured to mechanically support a circuit; a photosensitive layer disposed on at least a portion of at least one side of the substrate; and a light source configured to controllably define the conductive pathway in the photosensitive layer based on photoexcition of an area of the photosensitive layer corresponding with the conductive pathway, a change in the area photoexcited by the light source facilitating a change in the conductive pathway.

According to another embodiment, a method of forming a dynamically configurable conductive pathway includes disposing a substrate to mechanically support a circuit; disposing a photosensitive layer on at least a portion of a least one side of the substrate; and controlling a light source to define the conductive pathway in the photosensitivity layer based on photoexcitation of an area of the photosensitive layer corresponding with the conductive pathway, wherein changing the area photoexcited by the light source facilitates changing the conductive pathway.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As noted above, when alternative conductive paths (e.g., electrical connections, radio frequency pathways) are needed, they must be pre-placed and additional components, such as switches, must be included to facilitate any change in connectivity. For example, when a PCB is fabricated, the placement of the components and the connections between them are planned, and the connectivity paths between components are deposited. These connectivity paths carry the current from one component to another, for example. During operation of the circuit, if the connectivity paths need to be changed to modify the circuit for any reason, the change is possible if the PCB was fabricated with the additional connectivity paths as well as switches that facilitate the change. If no such additional paths and switching elements were implemented during fabrication of the PCB, the PCB must be modified to facilitate the change. Embodiments of the system and method detailed herein relate to dynamically configurable conductivity paths based on optically switchable elements. These switchable connectivity paths do not require pre-planning or additional components like switches. The system and method discussed herein apply to any surface or mechanical support with conductive traces or paths (e.g., circuit board, radome lining).

Figure 1:
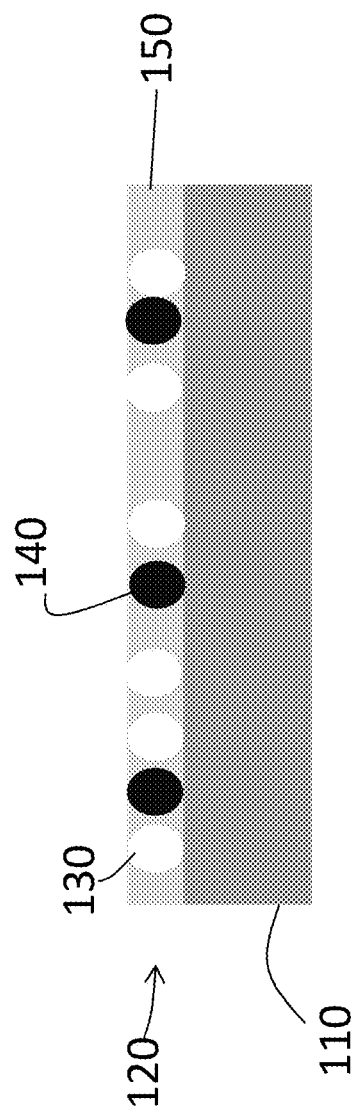
FIG. 1 is a cross-sectional view of a device with configurable conductivity paths according to an embodiment of the invention.

FIG. 1 is a cross-sectional view of a device with dynamically configurable conductivity pathways according to an embodiment of the invention. The embodiment shown in FIG. 1 includes a substrate 110 to mechanically support a photosensitive layer 120 with the configurable conductivity paths, but the exemplary embodiment does not limit the mechanical supports and shapes contemplated for the device. The substrate 110 is non-conductive and may be a dielectric layer. While the photosensitive layer 120 is shown as being deposited over one entire surface of the substrate 110 in FIG. 1, the photosensitive layer 120 may be deposited over at least a portion of at least one side of the substrate 110. The photosensitive layer 120 includes at least one type of optical switching element (OSE) 130, and may also include at least one type of field transmission element (FTE) 140, and one or more types of an immobilizing material (IM) 150. When the IM 150 is present, the OSE 130 and FTE 140 are fillers in the IM 150, which is the body of the film making up the photosensitive layer 120. The IM 150 is made from a material or a blend of materials that are transparent to high energy photons and provides mechanical and environmental stability to the fillers (OSE 130 and FTE 140). For example, the IM 150 may be a polymethyl methacrylate (PMMA), poly isobutylene (PIB), or poly ether imide (PEI). When the IM 150 is present, the filling factor must be sufficiently high for the fillers (OSE 130 and FTE 140) to be in electrical contact with one another but must also be sufficiently low such that the integrity of the resulting film is upheld. A ratio of FTE 140 to OSE 130 is material-dependent. A lower ratio (increasingly more OSE 130 than FTE 140) provides for higher resolution of conductive features when the photosensitive layer 120 is illuminated but higher transparency (radio frequency transparency) when the photosensitive layer 120 is not illuminated, while a higher ratio (increasingly more FTE 140 than OSE 130) provides for higher conductivity when the photosensitive layer 120 is illuminated and lower transparency (radio frequency transparency) when the photosensitive layer 120 is not illuminated.

The OSE 130 is a nanostructured semiconductor material that is sensitive to high energy photons. For example, the OSE 130 may include quantum dots (IIB-VIA, IVA-VIA, or IIIA-VA), vanadium oxide ($VO_2$), silicon nanoparticles, a semiconducting polymer, or other semiconducting material. The OSE 130 material can be induced to an electrically conductive state by the absorption of the photon. That is, when a light source illuminates the OSE 130, causing photoexcitation, the illuminated OSE 130 becomes conductive. Accordingly, a path of OSE 130 material may be illuminated to define a conductivity path within the photosensitive layer 120. The structure of the OSE 130 includes one or more materials that passivate the surface of the OSE 130 and thereby alter the material properties of the OSE 130. The FTE 140 is an inherently conductive nanostructured material. For example, the FTE 130 may include silver, copper, or gold nanoparticles (or another intrinsically conductive material) and may define the nanoparticulate equivalent of a transmission line. Exemplary materials that may be used as FTE 130 (and may also be used as passivating material or IM 150) include poly(3,4-ethylenedioxythiophene) poly(styrenesulfonate) (PEDOT:PSS), polyaniline (PANI), and poly(3-hexylthiophene) (P3HT). The FTE 140 may also include one or more passivating materials. These passivating materials may or may not be the same as the passivating materials in the structure of the OSE 130. Exemplary passivating materials include n-butylamine (n-But), ethanedithiol (EDT), and ethanediamine (EDA).

Figure 2:
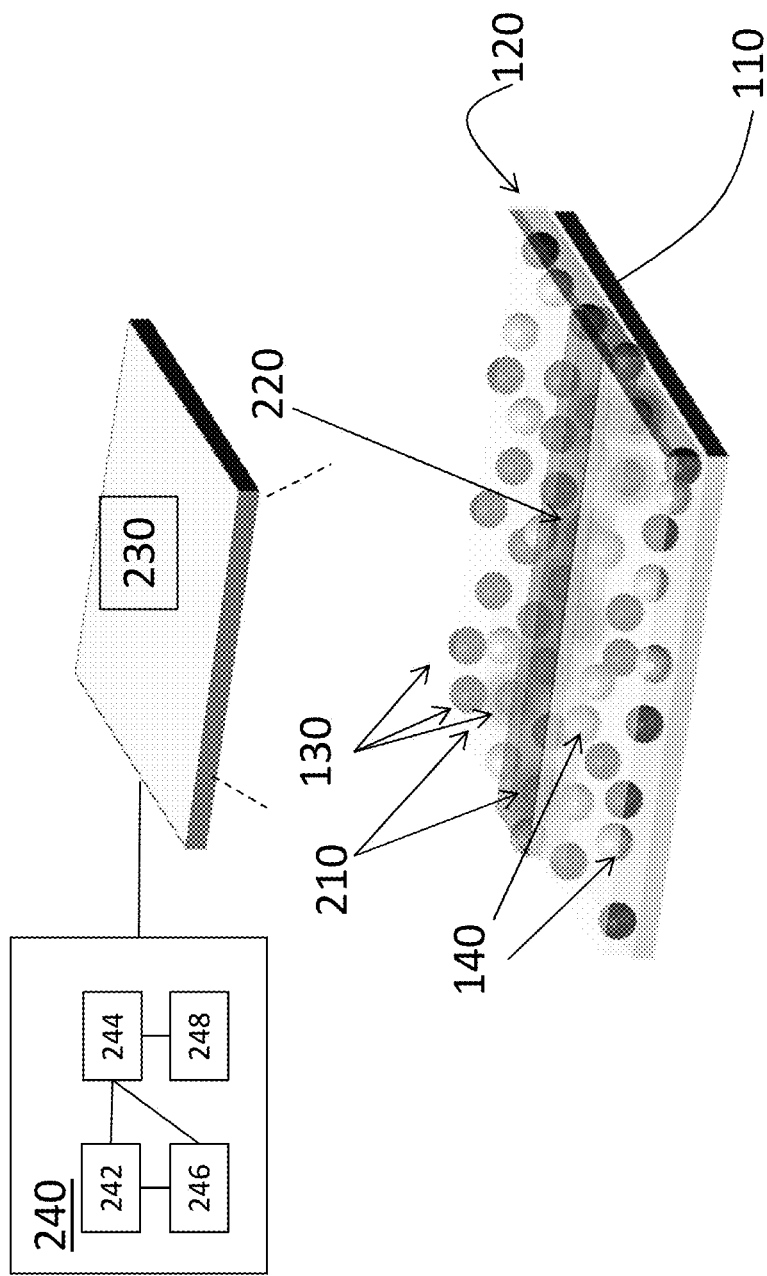
FIG. 2 shows a system to dynamically configure a conductive pathway according to an embodiment of the invention.

FIG. 2 shows a system to dynamically configure a conductive pathway according to an embodiment of the invention. As noted with reference to FIG. 1, the exemplary arrangement of the photosensitive layer 120 on the substrate 110 is not intended to limit the arrangement of the device. Both the OSE 130 and FTE 140 are shown as part of the photosensitive layer 120. The OSE 130 that are illuminated by a light source 230 (e.g., ultraviolet light. x-ray, visible, or other high energy light) are indicated by 210. While the light source 230 is shown separated from the photosensitive layer 120 in FIG. 2 for clarity, the light source 230 may be disposed directly on the photosensitive layer 120 to accurately control the areas of the photosensitive layer 120 that are illuminated. In alternate embodiments, backlighting or projection may be used to illuminate the OSE 130. A controller 240 may be used to control the light source 230. The controller 240 includes an input interface 242 (e.g., keyboard, output of another circuit), one or more processors 244, one or more memory devices 246, and an output interface 248 that outputs the signal to control the light source 230. The OSE 130 (210) that is illuminated forms conductive layers while the unilluminated OSE 130 (dark regions) are insulating. The specific regions that are conductive or that create conductive pathways between components when the device shown in FIG. 2 is incorporated in a circuit, for example, can be altered dynamically by changing the pattern of illumination. Thus, without apriori knowledge of conductive paths needed in the device, for example, the illumination by the light source 230 may be adjusted to dynamically form the conductivity path in the photosensitive layer 120.

Figure 3:
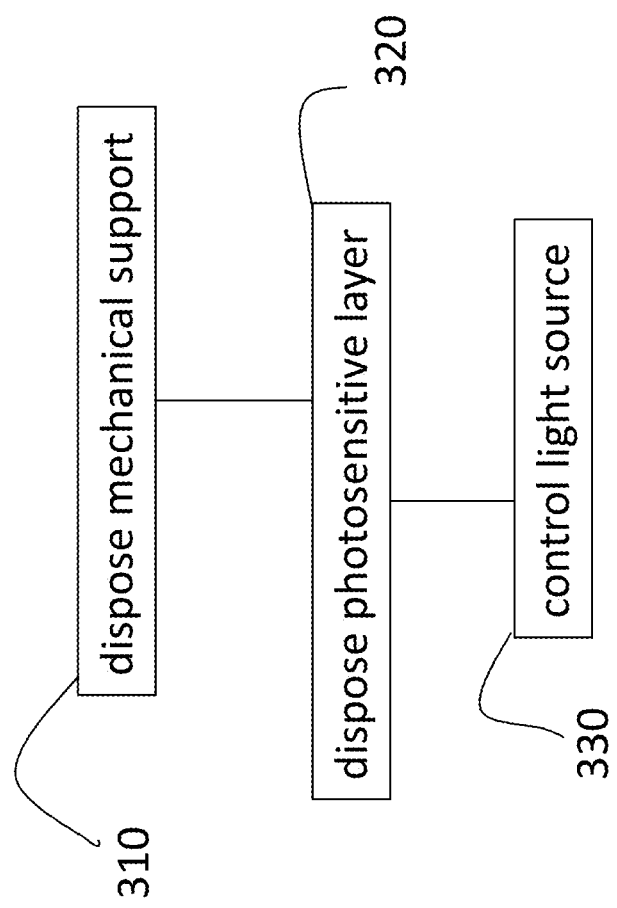
FIG. 3 is a process flow of a method of forming a dynamically configurable conductivity pathway according to an embodiment of the invention.

FIG. 3 is a process flow of a method of forming a dynamically configurable conductivity pathway according to an embodiment of the invention. At block 310, disposing a mechanical support includes disposing a substrate 110 for a circuit, for example. As noted above, the mechanical support may be any non-conductive surface on which the photosensitive layer 120 may be disposed. The mechanical support may be a radome, for example. At block 320, disposing the photosensitive layer 120 includes depositing the photosensitive layer 120 on at least part of at least one side of the mechanical support. As detailed above, the photosensitive layer 120 may include OSE 130 and FTE 140 that may be fillers in an IM 150. Controlling a light source 230 at block 330 facilitates changing conductivity of the OSE 130 in the photosensitive layer 120 to dynamically configure conductivity paths.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A system to dynamically configure a conductive pathway, the system comprising:
   a substrate configured to mechanically support a circuit;
   a photosensitive layer disposed on at least a portion of at least one side of the substrate; and
   a light source configured to controllably define the conductive pathway in the photosensitive layer based on photoexcitation of an area of the photosensitive layer corresponding with the conductive pathway, a change in the area photoexcited by the light source facilitating a change in the conductive pathway, wherein the photosensitive layer comprises an optical switching element which is quantum dots.

2. The system according to claim 1, wherein a structure of the at least one type of optical switching element includes passivating material that passivates a surface of the optical switching element.

3. The system according to claim 1, wherein the photosensitive layer comprises at least one type of field transmission element.

4. The system according to claim 3, wherein the at least one type of field transmission element is a conductive nanostructured element and includes one of silver, copper, gold nanoparticles, graphene, or carbon nanotubes.

5. The system according to claim 4, wherein the at least one type of field transmission element includes passivating material.

6. The system according to claim 1, wherein the photosensitive layer comprises at least one type of immobilizing material.

7. The system according to claim 6, wherein the photosensitive layer further comprises at least one type of optical switching element and at least one type of field transmission element, the at least one type of optical switching element and the at least one type of field transmission element being fillers in the immobilizing material.

8. The system according to claim 1, wherein the light source is a visible, ultraviolet, or x-ray light source, and the conductive pathway carries direct current.

9. A method of forming a dynamically configurable conductive pathway, the method comprising:
   disposing a substrate to mechanically support a circuit;
   disposing a photosensitive layer on at least a portion of a least one side of the substrate; and controlling a light source to define the conductive pathway in the photosensitive layer based on photoexcitation of an area of the photosensitive layer corresponding with the conductive pathway, wherein changing the area photoexcited by the light source facilitates instantaneously changing the conductive pathway.

10. The method according to claim 9, wherein the disposing the photosensitive layer includes disposing at least one type of optical switching element.

11. The method according to claim 10, wherein the disposing the at least one type of optical switching element includes disposing a nanostructured semiconductor that includes one of quantum dots, silicon (Si) nanoparticles, or a semiconducting polymer.

12. The method according to claim 11, wherein the disposing the at least one type of optical switching element includes passivating a surface of the optical switching element.

13. The method according to claim 9, wherein the disposing the photosensitive layer includes disposing at least one type of field transmission element.

14. The method according to claim 13, wherein the disposing the at least one type of field transmission element includes disposing a conductive nanostructured element and includes disposing one of silver, copper, gold nanoparticles, graphene, or carbon nanotubes.

15. The method according to claim 14, wherein the disposing the at least one type of field transmission element includes disposing a passivating material.

16. The method according to claim 9, wherein the disposing the photosensitive layer includes disposing at least one type of immobilizing material.

17. The method according to claim 16, wherein the disposing the photosensitive layer further includes disposing at least one type of optical switching element and at least one type of field transmission element, the at least one type of optical switching element and the at least one type of field transmission element being disposed as fillers in the immobilizing material.

18. The method according to claim 9, wherein the controlling the light source includes controlling a visible, ultraviolet, or x-ray light source, and the conductive pathway carries direct current.

* * * * *